United States Patent
Kaneko et al.

(10) Patent No.: US 8,797,757 B2
(45) Date of Patent: Aug. 5, 2014

(54) WIRING SUBSTRATE AND MANUFACTURING METHOD THEREOF

(75) Inventors: Kentaro Kaneko, Nagano (JP); Toshiaki Aoki, Nagano (JP); Kazuhiro Kobayashi, Nagano (JP); Kotaro Kodani, Nagano (JP); Junichi Nakamura, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 311 days.

(21) Appl. No.: 13/344,864

(22) Filed: Jan. 6, 2012

(65) Prior Publication Data

US 2012/0175153 A1     Jul. 12, 2012

(30) Foreign Application Priority Data

Jan. 11, 2011   (JP) ................. 2011-003423

(51) Int. Cl.
  *H05K 7/12*   (2006.01)
  *H05K 1/11*   (2006.01)
  *H05K 1/16*   (2006.01)

(52) U.S. Cl.
  USPC ........................ 361/767; 174/260; 174/262

(58) Field of Classification Search
  USPC .......... 174/250, 257, 260–262; 361/760, 767, 361/768
  See application file for complete search history.

(56) References Cited

U.S. PATENT DOCUMENTS

| | | | |
|---|---|---|---|
| 8,022,553 B2 | 9/2011 | Ahn et al. | |
| 8,238,114 B2 | 8/2012 | Niki et al. | |
| 2006/0124351 A1* | 6/2006 | Kusano et al. | 174/261 |
| 2008/0029297 A1* | 2/2008 | Nakamura | 174/264 |
| 2009/0154132 A1* | 6/2009 | Okamoto et al. | 361/804 |
| 2009/0309210 A1* | 12/2009 | Danno | 257/690 |
| 2011/0296681 A1 | 12/2011 | Niki et al. | |
| 2011/0302779 A1 | 12/2011 | Niki et al. | |
| 2011/0303636 A1 | 12/2011 | Ahn et al. | |
| 2012/0181072 A1 | 7/2012 | Niki et al. | |

FOREIGN PATENT DOCUMENTS

| | | |
|---|---|---|
| JP | 2001-068858 | 3/2001 |
| JP | 2002-050876 | 2/2002 |
| JP | 2005-108941 | 4/2005 |
| JP | 2005-244104 | 9/2005 |
| JP | 2006-059863 | 3/2006 |
| JP | 2009-004772 | 1/2009 |
| JP | 2009-272512 | 11/2009 |
| WO | WO2009/037939 | 3/2009 |

OTHER PUBLICATIONS

Office Action dated Jun. 17, 2014 issued with respect to the basic Japanese Patent Application No. 2011-003423.

* cited by examiner

*Primary Examiner* — Hoa C Nguyen
(74) *Attorney, Agent, or Firm* — IPUSA, PLLC

(57) ABSTRACT

A wiring substrate includes plural insulating layers including an outermost insulating layer; and plural wiring layers which are alternately laminated between the insulating layers and include outermost wiring layers exposed from the outermost insulating layer and through wirings having electrode pads on end portions of the through wirings and penetrating through the outermost insulating layer, wherein the electrode pads of the through wirings are exposed from the outermost insulating layer, and a part of the outermost wiring layers overlaps the end portions of the through wirings and is connected to the through wirings.

5 Claims, 20 Drawing Sheets

WIRING SUBSTRATE AND MANUFACTURING METHOD THEREOF

CROSS-REFERENCE TO RELATED APPLICATIONS

This patent application is based upon and claims the benefit of priority of the prior Japanese Patent Application No. 2011-003423 filed on Jan. 11, 2011, the entire contents of which are incorporated herein by reference.

FIELD

The embodiments discussed herein are related to a wiring substrate formed by laminating a wiring layer and an insulating layer and a manufacturing method of the wiring layer.

BACKGROUND

Japanese Laid-open Patent Publication No. 2005-244104 discloses processes performed in the following order, namely, a covering process for covering the first main surface of a metal plate used as a support substrate for reinforcement in manufacture with a metal thin-film layer having selective etching properties to the metal plate; a lamination process for forming a conductive pattern for forming a metal terminal pad on the first main surface of the metal thin-film layer, and forming a wiring laminated section, by alternately laminating the dielectric layer made of a polymer material and the metal conductive layer, after the covering process; and an etching process for removing the metal plate by selective etching, removing the metal thin-film layer by selective etching, and exposing a conductive pattern 11 formed at the side of the first main surface of the metal thin-film layer, after the lamination process.

Japanese Laid-open Patent Publication No. 2006-059863 discloses a package substrate having no land on the surface layer of a part mounting pad, wherein a circuit surface and an interlayer connection via surface are formed on the same plane as an insulating layer surface in the part mounting pad. Its manufacturing method includes a process where a nickel plating is used as a supporting body and an insulating layer and an interlayer connection via are formed thereon, and a process where the nickel supporting body is peeled off to form the part mounting pad having the interlayer connection via as the surface layer.

According to these methods, a pitch of electrode pads may not be further narrowed.

SUMMARY

According to an aspect of the embodiment, a wiring substrate includes plural insulating layers including an outermost insulating layer; and plural wiring layers which are alternately laminated between the insulating layers and include outermost wiring layers exposed from the outermost insulating layer and through wirings having electrode pads on end portions of the through wirings and penetrating through the outermost insulating layer, wherein the electrode pads of the through wirings are exposed from the outermost insulating layer, and a part of the outermost wiring layers overlaps the end portions of the through wirings and is connected to the through wirings.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

DESCRIPTION OF EMBODIMENTS

Figure 1:
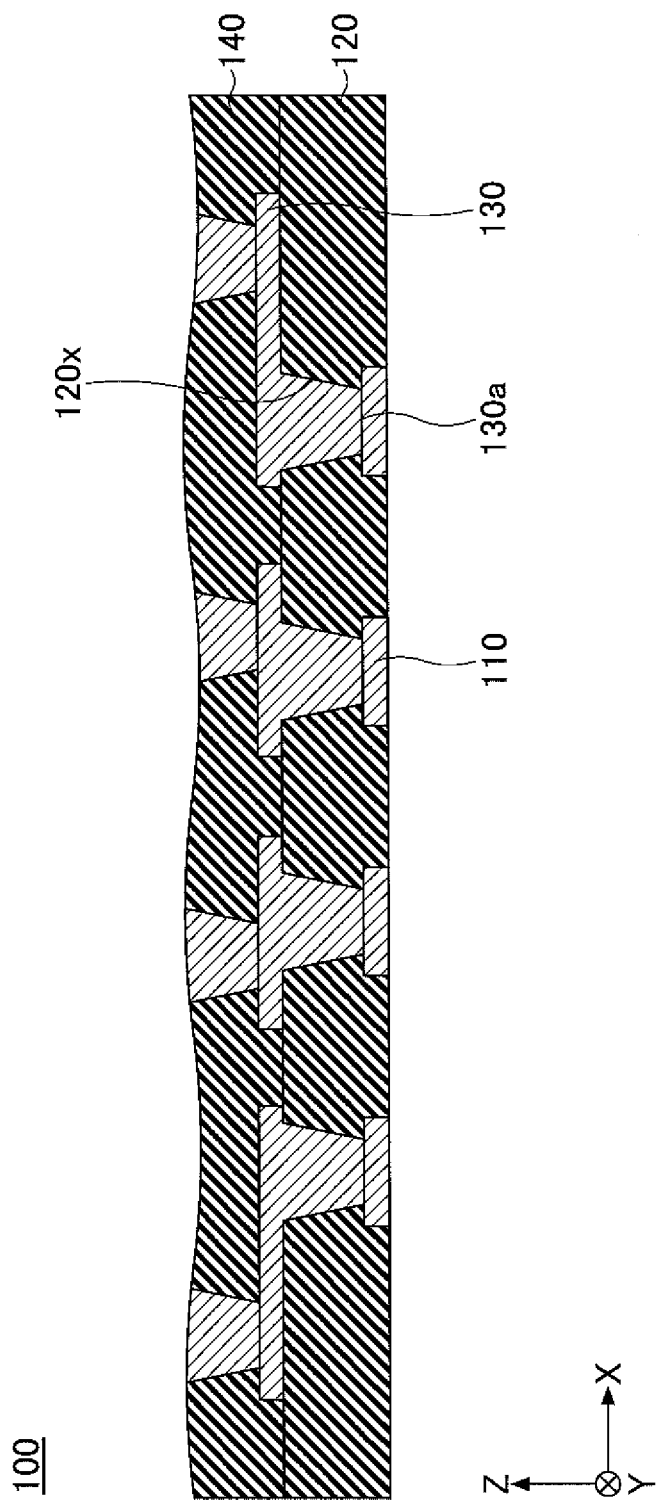
FIG. 1 is a first partial cross-sectional view of an exemplary wiring substrate.
Figure 2:
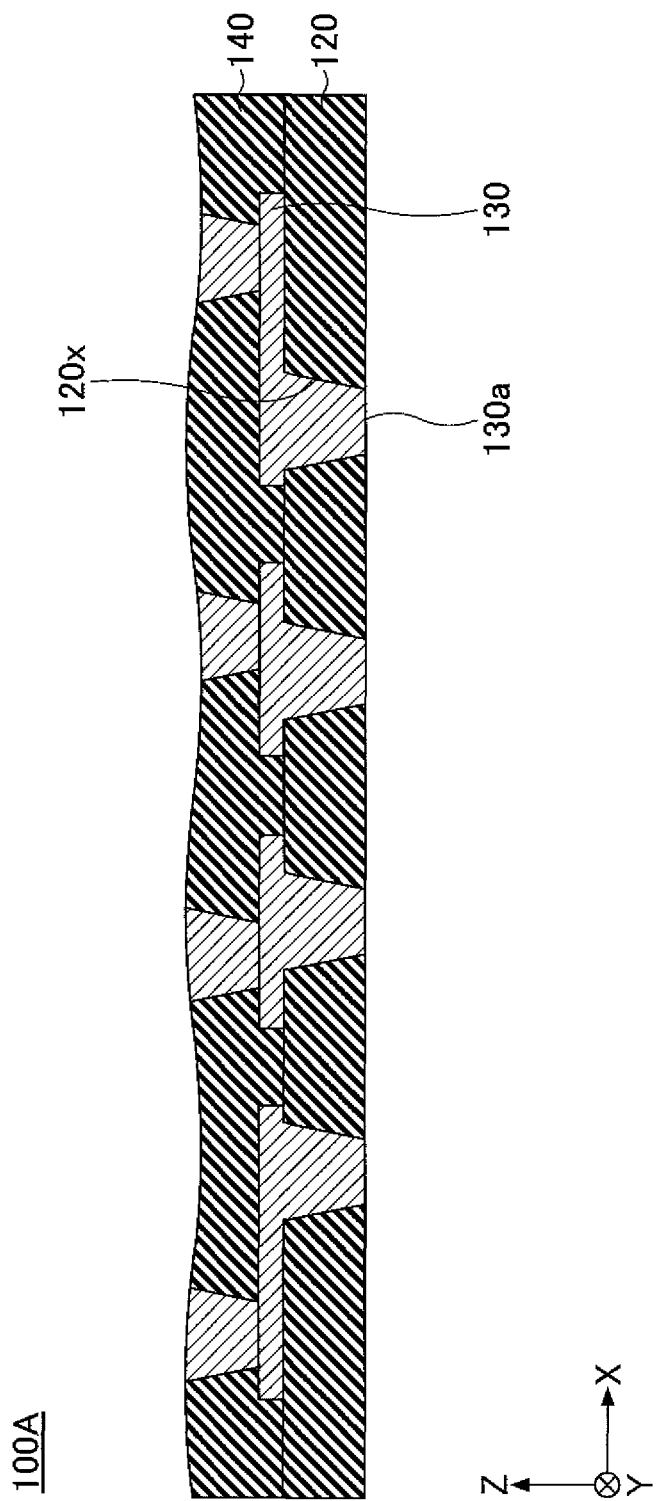
FIG. 2 is a second partial cross-sectional view of another exemplary wiring substrate.
Figure 3:
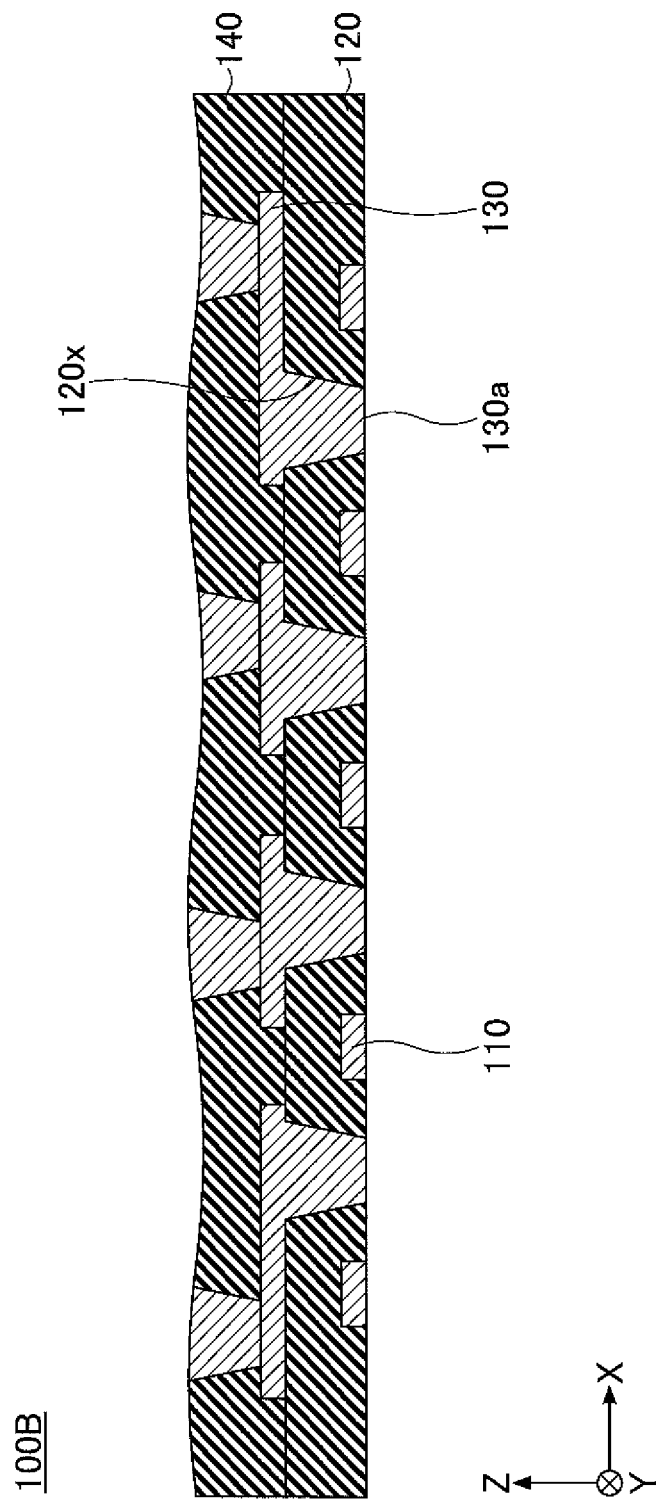
FIG. 3 is a third partial cross-sectional view of another exemplary wiring substrate.
Figure 4:
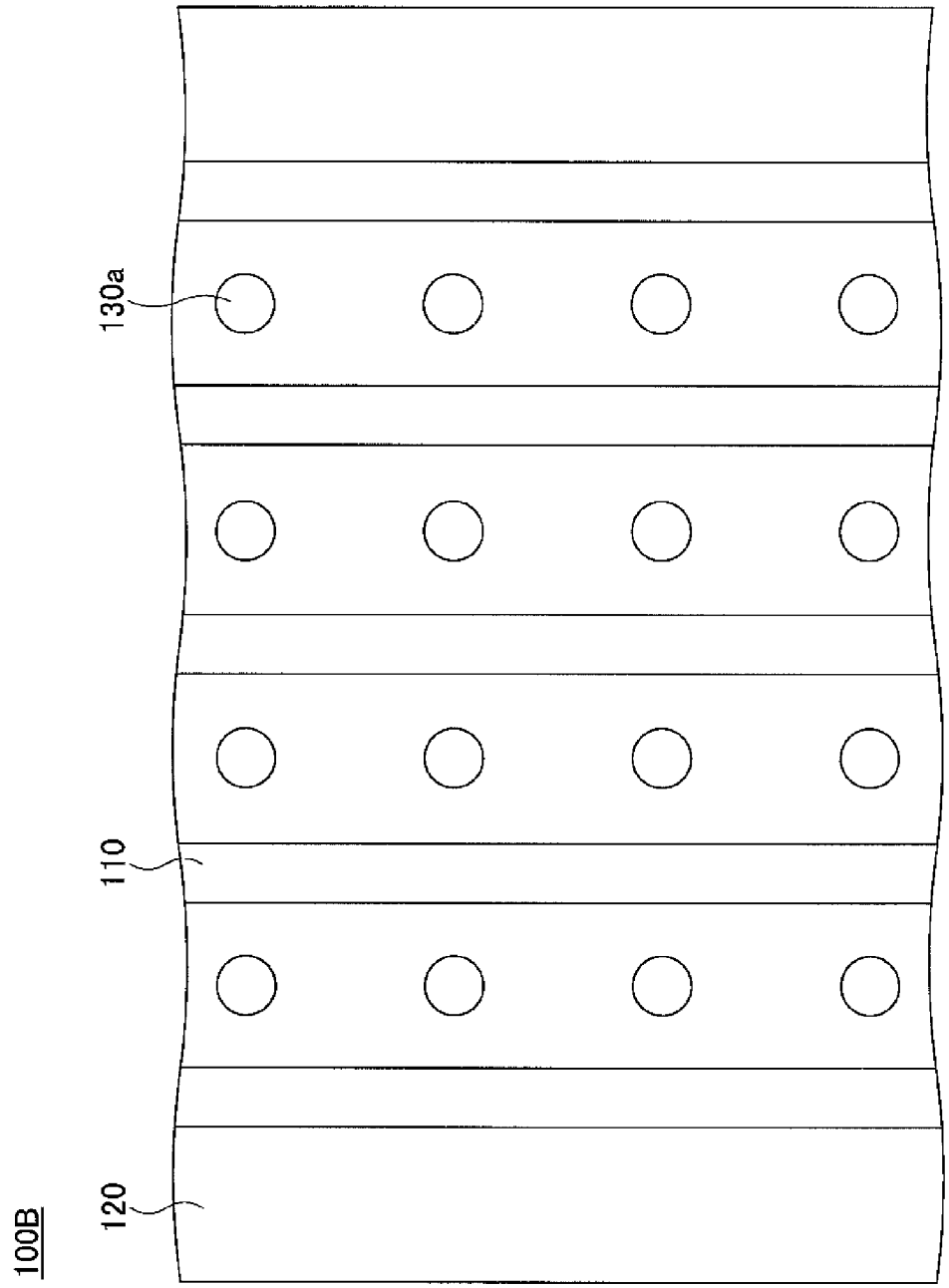
FIG. 4 is a partial bottom view of the exemplary wiring substrate of FIG. 3.

A wiring substrate may be formed by laminating an insulating layer and a wiring layer. FIG. 1 to FIG. 3 are plan views of exemplary wiring substrates. FIG. 4 is a bottom view of the exemplary wiring substrate illustrated in FIG. 3.

Referring to FIG. 1, the wiring substrate 100 has a structure in which first wiring layers 110, a first insulating layer 120, second wiring layers 130, a second insulating layer 140 and so on are sequentially laminated. The first wiring layers 110 are electrically connected to the second wiring layers 130 through via wirings (parts of the second wiring layers 130) filling via holes 120x penetrating through the first insulating layer 120. The lower faces of the first wiring layers 110 are exposed from the first insulating layer 120 and function as electrode pads to be connected to a semiconductor chip (hereinafter, the first wiring layers 110 may also be referred to as electrode pads 110).

Referring to FIG. 1, the electrode pads 110 are formed on faces 130a of the via wirings 130 filling the via holes 120x, and the area of the lower faces of the electrode pads 110 is greater than the area of the faces 130a of the via wirings 130. In this case, a pitch of the electrode pads 110 may be prevented from being narrowed.

Referring to a wiring substrate 100A of FIG. 2, the first wiring layers 110 may not be formed and end portions of the via wirings 130 in the vicinity of the faces 130a may function as the electrode pads (hereinafter, the end portions of the via wirings may also be referred to as the electrode pads 130a).

Referring to a wiring substrate 100B of FIG. 3 and FIG. 4, the first wiring layers 110 may be wired as the wiring patterns on a region where the electrode pads 130a are not provided. Since in the wiring substrate 100B, the first wiring layers 110 are wired as the wiring patterns on the region where the electrode pads 130a are not provided, a degree of freedom in designing wirings may become high in comparison with the wiring substrate 100 illustrated in FIG. 1 and the wiring substrate 100A illustrated in FIG. 2. Therefore, the structure of the wiring substrate 100B may be suitable for narrowing the pitch of the electrode pads 130 to some extent. In this case, the pitch of the electrode pads 130a may be about 120 through 150 μm.

Preferred embodiments of the present invention will be explained with reference to accompanying drawings. The same reference numerals may be provided to the corresponding portions in the figures and description of these portions may be omitted.

[a] First Embodiment

Structure of Wiring Substrate of First Embodiment

Figure 5:
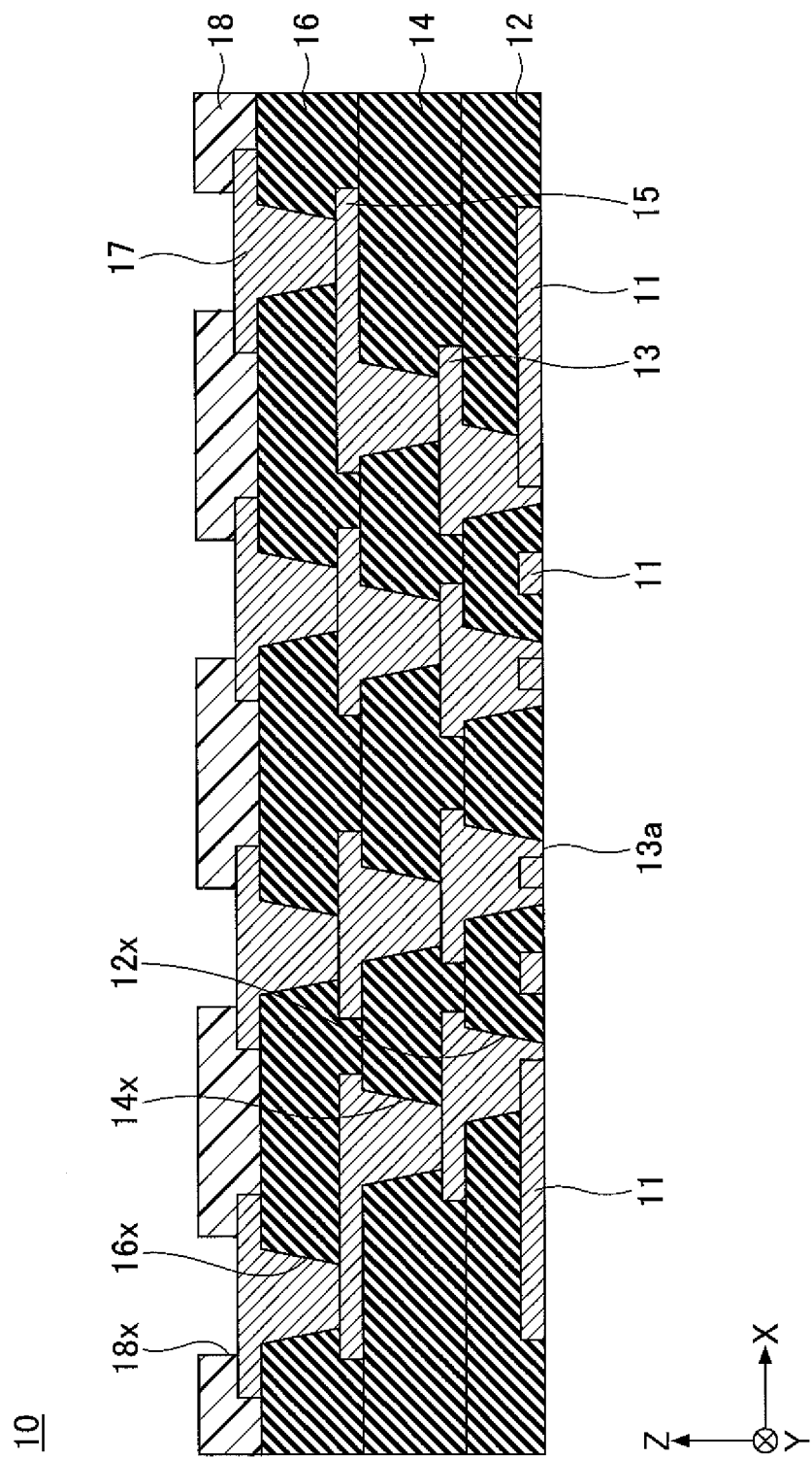
FIG. 5 is a cross-sectional view of an exemplary wiring substrate of First Embodiment.
Figure 6:
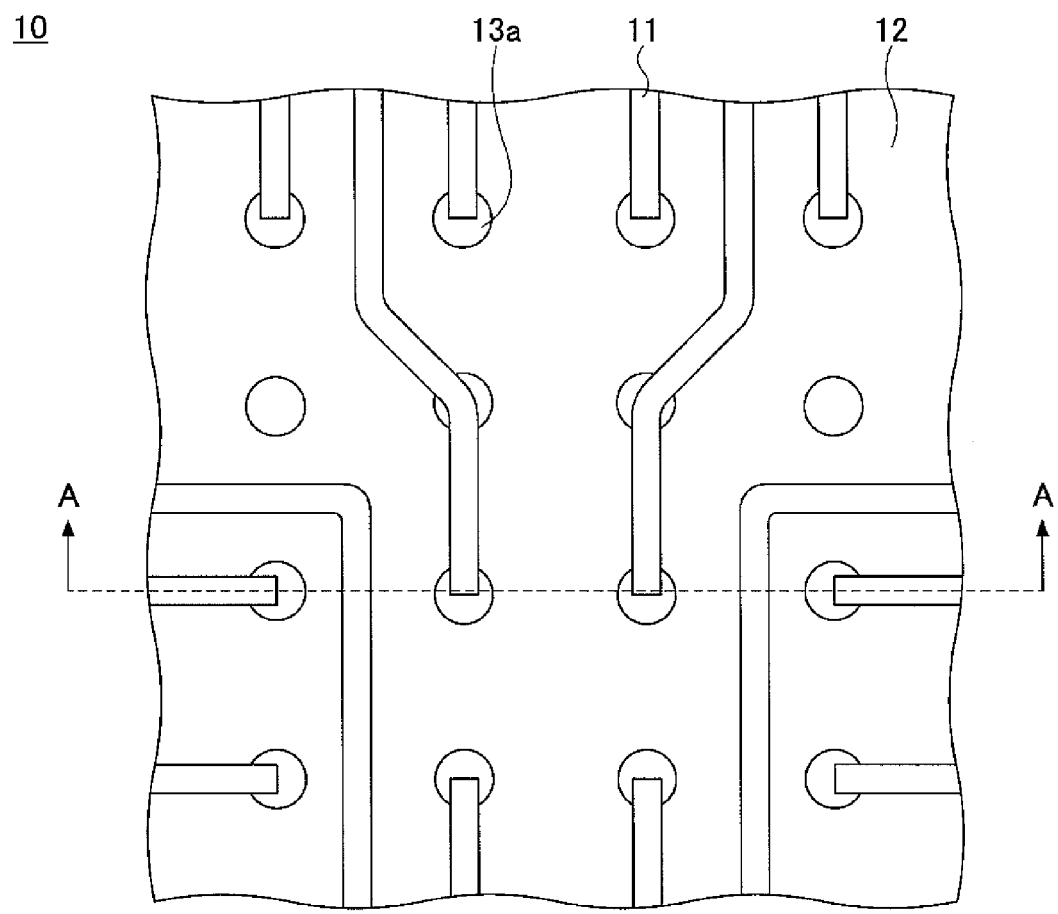
FIG. 6 is a partial bottom view of the exemplary wiring substrate of the First Embodiment.

The structure of the wiring substrate of the First Embodiment is described. FIG. 5 is a cross-sectional view of an example wiring substrate of the First Embodiment. FIG. 6 is a partial bottom view of the example wiring substrate of the First Embodiment. FIG. 5 illustrates a cross-sectional view of FIG. 6 taken along a line A-A. Referring to FIG. 5 and FIG. 6, the wiring substrate 10 of the First Embodiment is a cureless builtup wiring substrate having a structure in which first wiring layers 11, a first insulating layer 12, second wiring layers 13, a second insulating layer 14, third wiring layers 15, a third insulating layer 16, fourth wiring layers 17 and a solder resist layer 18 are sequentially laminated.

For convenience, the side of the first insulating layer 12 in the wiring substrate 10 is called an lower side, and the side of the solder resist layer 18 in the wiring substrate 10 is called an upper side in the First Embodiment. A surface of the first insulating layer 12 in contact with the second insulating layer 14 is the upper surface, and a surface of the first insulating layer 12 exposed to the outside (the surface opposite to the surface in contact with the second insulating layer 14) is the lower surface.

The upper surfaces (the surfaces on the side of the second wiring layer 13) of the first wiring layers 11 are covered by the first insulating layer 12. The side surfaces of the first wiring layers 11 are also covered by the first insulating layer 12. The lower surfaces (the surface opposite to the upper surface) of the first wiring layers 11 are exposed from the first insulating layer 12. The lower surfaces of the first wiring layers 11 and the lower surface of the first insulating layer 12 are substantially on the same plane. For example, the material of the first wiring layers 11 may be copper (Cu) or the like. For example, the thicknesses of the first wiring layers 11 may be about 10 to 20 μm. As for the pitch of the first wiring layers 11, for example, the widths of the lines and the spaces (line/space) are about 8 μm/8 μm to 15 μm/15 μm.

If the line widths of the first wiring layer 11 are less than diameters of the electrode pads 13 (described below), contact areas between the first wiring layers 11 and the first electrode pads 13 increase to improve the connection reliability.

The first insulating layer 12 is formed to cover the upper surfaces and the side surfaces of the first wiring layers 11 and enable the lower surfaces of the first wiring layers 11 to be exposed outside. For example, the material of the first insulating layer 12 may be an insulating resin mainly containing an epoxy resin or the like. The insulating resin which is the material of the first insulating layer 12 may be a thermoset resin. The thickness of the first insulating layer 12 may be about 15 through 35 μm. The first insulating layer 12 may contain a filler such as silica ($SiO_2$).

The second wiring layers 13 are formed on the first insulating layer 12. The second wiring layers 13 penetrate the first insulating layer 12 and are formed to include via wirings (through wirings) filling first via holes 12x and wiring patterns formed on the first insulating layer 12. The first via holes 12x are shaped like truncated cones in which the areas of opening portions on the side of the second insulating layer 14 are greater than the areas of the opening portions on the lower side of the wiring substrate 10. The material of the second wiring layers 13 may be copper (Cu) or the like. The thicknesses of the second wiring layers 13 may be about 10 to 20 μm.

The faces 13a of the via wirings forming the second wiring layers 13 are exposed from the lower surface of the first insulating layer 12. The faces 13a of the via wirings and the lower surface of the first insulating layer 12 are substantially on the same plane. Said differently, the lower surfaces of the first wiring layers 11 and the faces 13a of the via wirings are exposed from the lower surface of the first insulating layer 12. The lower surfaces of the first wiring layers 11 and the faces 13a of the via wirings are substantially on the same plane. In the via wirings forming the second wiring layers 13, portions of the via wirings having thicknesses from the faces 13a of the via wirings substantially the same as those of the first wiring layers 11 may be referred to as end portions of the via wirings. The end portions of the via wirings forming the second wiring layers function as electrode pads electrically connected to a semiconductor chip (not illustrated). Hereinafter, the end portions of the via wirings forming the second wiring layers 13 may be referred to as first electrode pads 13.

With the First Embodiment, the semiconductor chip is to be mounted on the side of the first electrode pads 13. The exposed faces (the faces 13a of the via wirings) of the first electrode pads 13 are shaped like circles in their plan views. For example, the diameters of the circles are about 40 to 60 μm. The diameter of the exposed faces (the faces 13a of the via wirings) of the first electrode pads 13 are smaller than the diameters of the faces of the via wirings on the side of the second insulating layer 14. For example, the pitch of the first electrode pads 13 is about 70 to 100 μm.

The first electrode pads 13 (the end portions of the via wirings) are formed to contain the first wiring layers 11. Said differently, the first wiring layers 11 are wired as wiring patterns while contacting the first electrode pads 13. However, all of the first electrode pads 13 may not contact the first wiring layers 11. A part of the first electrode pads 13 which do not contain the first wiring layers 11 are not directly connected to the first wiring layers 11 and are electrically connected to other wiring layers forming second wiring layers 13 by way of the via wirings and the wiring patterns. A part of the first wiring patterns 11 may be wired between the adjacent first electrode pads 13.

With the First Embodiment, the first wiring patterns 11 are wired as the wiring pattern from the first electrode pads 13 (the end portions of the via wirings). In comparison with the structure of wiring the wiring pattern in which the first wiring layers 110 are wired only on a region having no electrode pads 130 (the pitch of the electrode pads 130 is about 120 to 150 µm) illustrated in FIG. 3 and FIG. 4, the pitch of the first electrode pads 13 is about 70 to 100 µm.

The diameters of the exposed faces (the faces 13a) of the first electrode pads 13 (the portions of the via wirings) are smaller than the diameters of the first electrode pads 13 on the side of the second insulating layer 14 to thereby form a tapered shape. A part or all of the first electrode pads 13 cover and are in contact with the upper surfaces and the side surfaces of the first wiring layers 11, for example, by overlapping the first wiring layers 11. Therefore, the tensile strength of the first electrode pads 13 is great to thereby improve connection reliability when the semiconductor chip is mounted on the first electrode pads 13. In the semiconductor package in which the semiconductor chip is mounted on the first electrode pads 13 of the wiring substrate 10 illustrated in, for example, FIG. 18, the connection reliability between the first electrode pads 13 and the semiconductor chip can be improved even though heat stress is applied to the connecting portion between the first electrode pads and the semiconductor chip.

The second insulating layer 14 is formed to cover the second wiring layers 13 on the first insulating layer 12. The material of the second insulating layer 14 is similar to that of the first insulating layer 12 such as an insulating resin. The thickness of the second insulating layer 14 may be about 15 µm to 35 µm. The second insulating layer 14 may contain a filler such as silica ($SiO_2$).

The third wiring layers 15 are formed on the second insulating layer 14. The third wiring layers 15 include via wirings which penetrate through the second insulating layer 14 to fill second via holes 14x exposing the upper surfaces of the second wiring layers 13, and wiring patterns formed on the second insulating layer 14. The second via holes 14x are opened on the side of the third insulating layer 16 and the bottom faces of the second via holes 14x are formed by the upper surfaces of the second wiring layers 13. The areas of the opening portions are greater than the areas of the bottom faces to form recesses in a shape of a truncated cone. The via wirings are formed inside the recesses.

The third wiring layers 15 are electrically connected to the second wiring layers 13 exposed at the bottom portions of the second via holes 14x. For example, the material of the third wiring layer 15 may be copper (Cu) or the like. For example, the thicknesses of the third wiring layers 15 may be about 10 to 20 µm.

The third insulating layer 16 is formed to cover the third wiring layers 15 on the second insulating layer 14. The material of the third insulating layer 16 is similar to the materials of the first insulating layer 12 and the second insulating layer 14 such as an insulating resin. For example, the thickness of the third insulating layer 16 may be about 15 through 35 µm. The third insulating layer 16 may contain a filler such as silica ($SiO_2$).

The fourth wiring layers 17 are formed on the third insulating layer 16. The fourth wiring layers 17 include via wirings which penetrate through the third insulating layer 16 and fill third via holes 16x, from which the upper surface of the third wiring layer 15 is exposed, and a wiring pattern formed on the third insulating layer 16. The third via holes 16x are open on the side of the solder resist layer 18 and the bottom faces of the third via holes 16x are formed by the upper surfaces of the third wiring layers 15. The areas of the opening portions are greater than the areas of the bottom faces to form recesses in a shape of a truncated cone. The via wirings are formed inside the recesses.

The fourth wiring layers 17 are electrically connected to the third wiring layers 15 exposed at the bottom portions of the third via holes 16x. For example, the material of the fourth wiring layers 17 may be copper (Cu) or the like. For example, the thicknesses of the fourth wiring layers 17 may be about 10 to 20 µm.

The solder resist layer 18 is formed to cover the fourth wiring layers 17 on the third insulating layer 16. The solder resist layer 18 includes opening portions 18x, and parts of the fourth wiring layers 17 are exposed at the bottom portions of the opening portions 18x. The fourth wiring layers 17 exposed at the bottom portions of the opening portions 18x function as electrode pads which are electrically connected to a mounting board (not illustrated) such as a motherboard. When necessary, metallic layers or the like may be formed on the fourth wiring layers 17 which are exposed at the bottom portions of the opening portions 18x. An example of the metallic layers is an Au layer, a Ni/Au layer which is a metallic layer formed by laminating a Ni layer and an Au layer in this order, a Ni/Pd/Au layer which is a metallic layer formed by laminating a Ni layer, a Pd layer, and an Au layer in this order or the like.

External connection terminals such as a solder ball and a pin may be formed on the fourth wiring layers 17 which are exposed at the bottom portions of the opening portions 18x or on the metallic layers when the metallic layers are formed on the fourth wiring layers 17 exposed at the bottom portions of the opening portions 18x. The external connection terminals are provided to electrically connect the wiring substrate to the mounting board (not illustrated) such as a motherboard. However, the fourth wiring layers 17 exposed at the bottom portions of the opening portions 18x or the metallic layers when the metallic layers are formed on the fourth wiring layers 17 may be used as the external connection terminals.

Hereinafter, the fourth wiring layers 17 exposed at the bottom portions 18x may be referred to as the second electrode pads 17. With the First Embodiment, the second electrode pads 17 may be the external connection terminals. The plan views of the second electrode pads 17 may be like circles having diameters of about 200 through 1000 µm. The pitch of the second electrode pads 17 is greater than the pitch of the first electrode pads 13 (e.g., about 100 to 200 µm). For example, the pitch of the second electrode pads 17 may be about 500 to 1200 µm.

In the wiring substrate 10, the wiring patterns forming the fourth wiring layers are wired over the third insulating layer. The wiring patterns over the third insulating layer 16 are exposed from the opening portions 16x of the solder resist layer 18. Then, the wiring patterns may be used as the second electrode pads 17. Said differently, portions of the fourth wiring layers 17 other than upper portions of the third via holes 16x may be used as the second electrode pads 17.

A Manufacturing Method of the Wiring Substrate of the First Embodiment

Next, the manufacturing method of the wiring substrate of the First Embodiment is described. FIG. 7 to FIG. 16 illustrate exemplary manufacturing processes of the wiring substrate of the First Embodiment.

Figure 7:
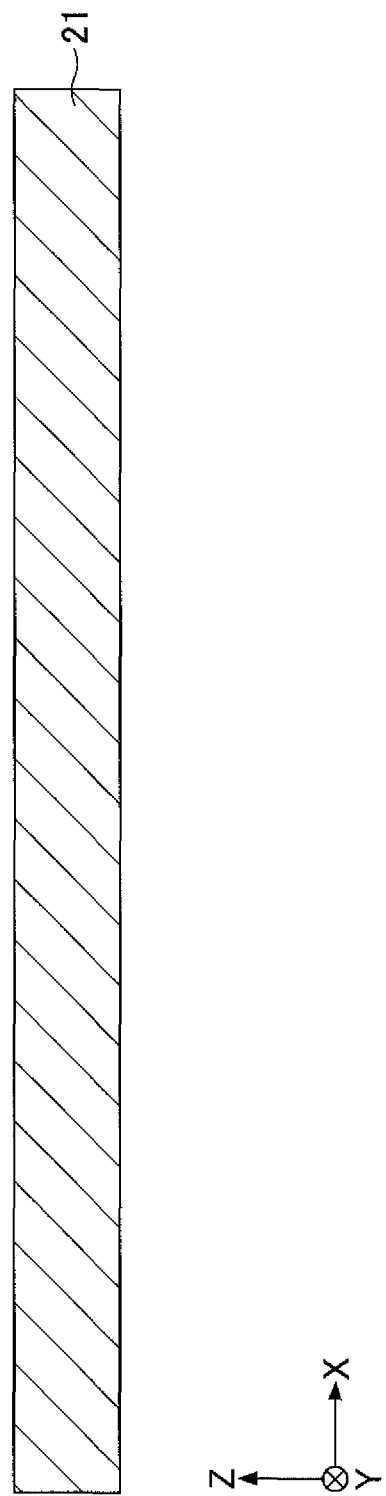
FIG. 7 is a first view of the exemplary manufacturing process of the wiring substrate of the First Embodiment.

Referring to FIG. 7, a supporting body 21 is prepared. The supporting body 21 is a silicon plate, a glass plate, a metallic plate, a metallic foil, or the like. A copper foil is used as the supporting body 21 in the First Embodiment. This is because the supporting body 21 may be used as a power supply layer for electrolytic plating in processes illustrated in FIG. 8 and FIG. 10. The supporting body 21 can be easily removed in the process illustrated in FIG. 16 described below. For example, the thickness of the supporting body 21 may be about 35 to 100 μm.

Figure 8:
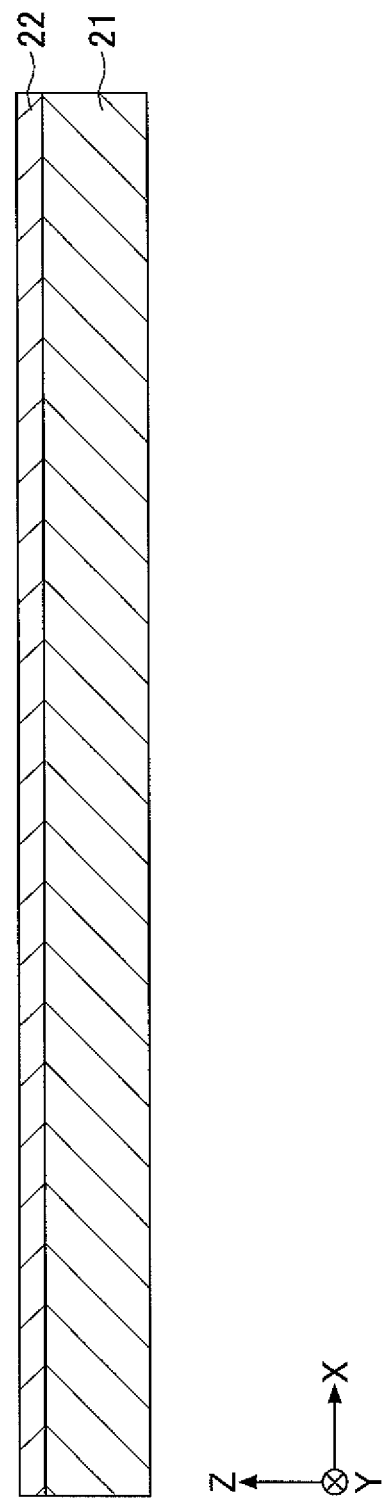
FIG. 8 is a second view of the exemplary manufacturing process of the wiring substrate of the First Embodiment.

In the process illustrated in FIG. 8, an etching stopper layer 22 is formed on one surface of the supporting body 21 by an electrolytic plating method using the supporting body 21 as a power supply layer. For example, the material of the etching stopper layer 22 may be nickel (Ni). For example, the thickness of the etching stopper layer 22 may be about 1 to 3 μm. However, in the process illustrated in FIG. 16 described below, the material other than nickel such as tin (Sn) and chrome (Cr) may be used as the etching stopper as long as the material is not removed by etching in removing the supporting body 21.

Figure 9:
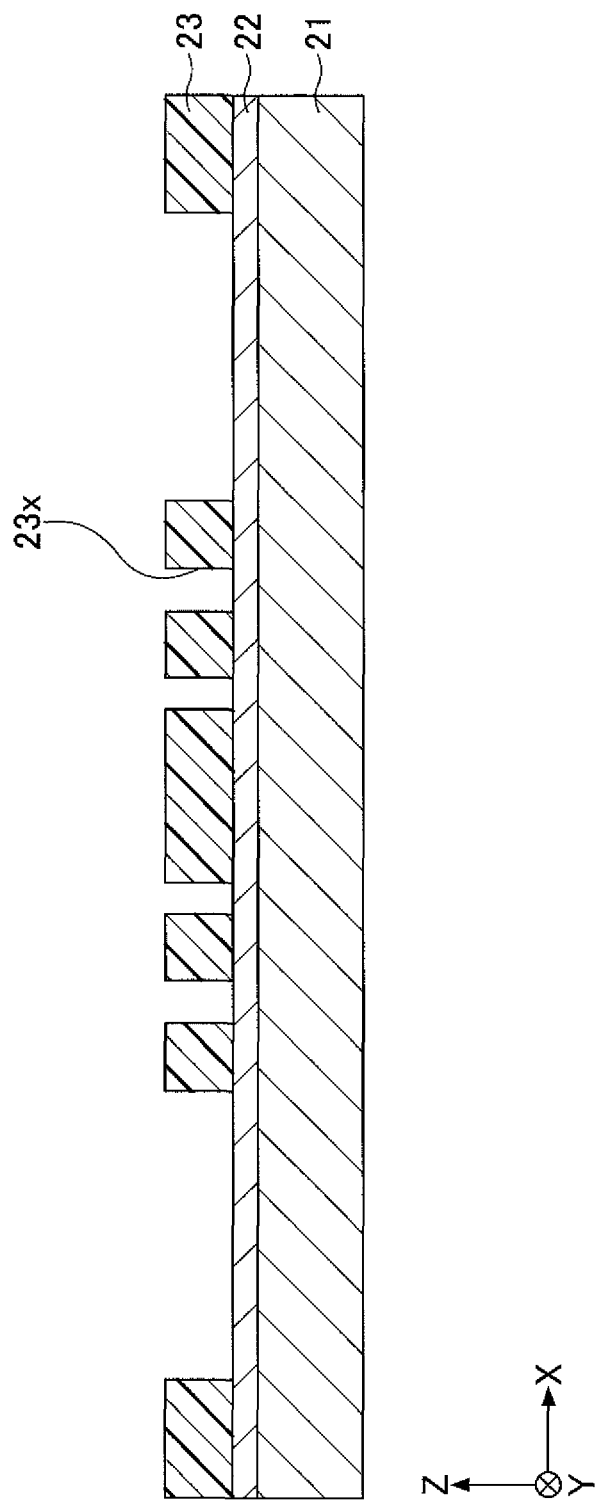
FIG. 9 is a third view of the exemplary manufacturing process of the wiring substrate of the First Embodiment.

In the process illustrated in FIG. 9, a resist layer 23 having opening portions 23x corresponding to the first wiring layers 11 is formed on one surface of the supporting body 21. Specifically, a liquid-like or paste-like resist made of a photosensitive resin material containing an epoxy resin, an acrylic resin or the like is coated on the etching stopper layer 22. Alternatively, a film resist such as a dry film resist made of a photosensitive resin material containing an epoxy resin, an acrylic resin or the like is laminated on the etching stopper layer 22. By irradiating the coated or laminated resist with light and developing the coated or laminated resist, the opening portion 23x is formed. With this, the resist layer 23 having the opening portion 23x is formed. It is possible to laminate a film-like resist previously having the opening portions 23x on the etching stopper layer 22. The opening portions 23x are formed at positions corresponding to the first wiring layers 11 to be formed in the process illustrated in FIG. 10 described below.

Figure 10:
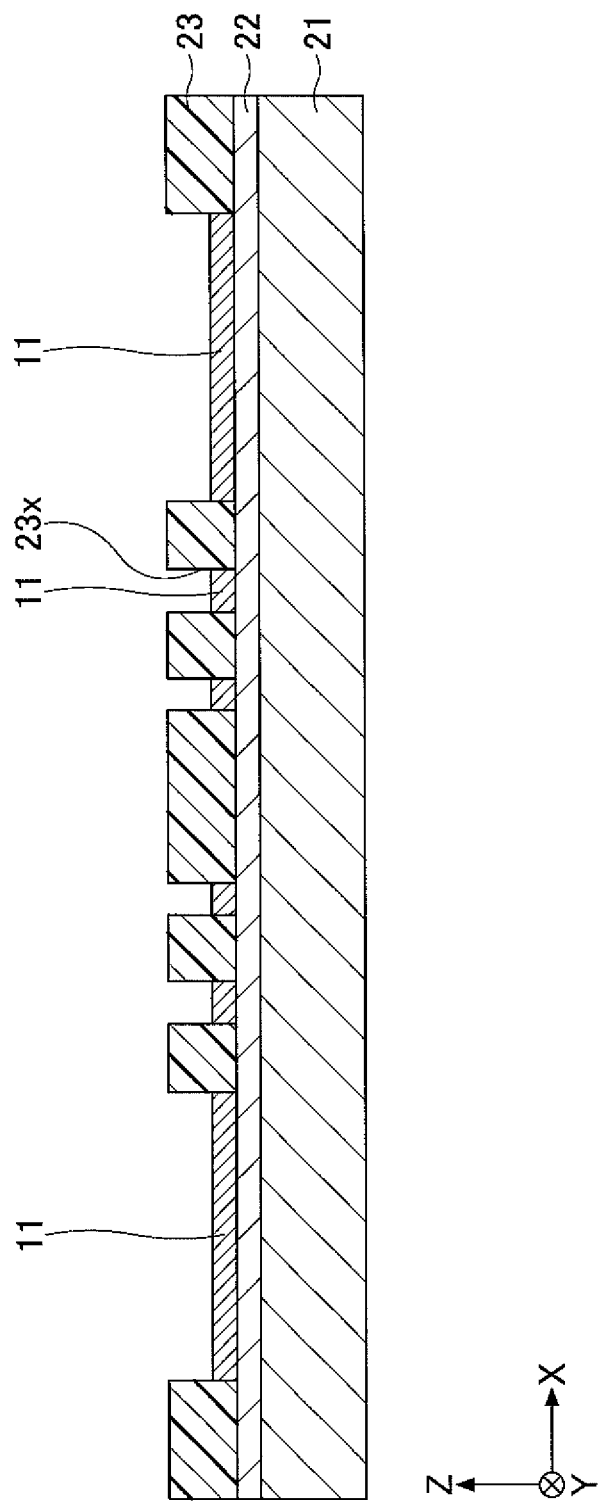
FIG. 10 is a fourth view of the exemplary manufacturing process of the wiring substrate of the First Embodiment.

In the process illustrated in FIG. 10, the first wiring layers 11 are formed inside the opening portions 23x on the etching stopper layer 22 by an electrolytic plating method in which the supporting body 21 is used as the power supply layer. For example, the material of the first wiring layers 11 may be copper (Cu) or the like. For example, the thicknesses of the first wiring layers 11 may be about 10 to 20 μm. As for the pitch of the first wiring layers 11, for example, the widths of the lines and the spaces (line/space) are about 8 μm/8 μm to 15 μm/15 μm.

Figure 11:
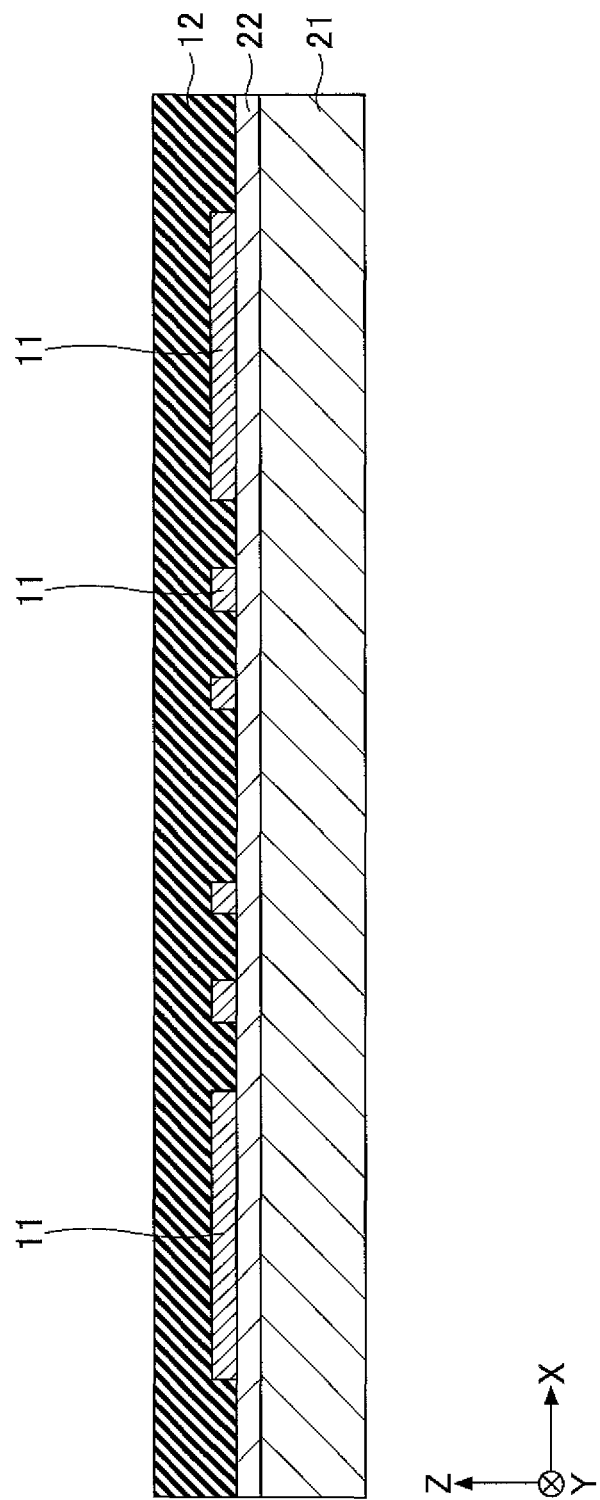
FIG. 11 is a fifth view of the exemplary manufacturing process of the wiring substrate of the First Embodiment.

Referring to FIG. 11, after removing the resist layer 23 illustrated in FIG. 10, the first insulating layer 12 is formed on the etching stopper layer 22 so as to cover the first wiring layer 11. For example, the material of the first insulating layer 12 may be an insulating resin mainly containing an epoxy resin. The thickness of the first insulating layer 12 may be about 15 through 35 μm. The first insulating layer 12 may contain a filler made of silica ($SiO_2$).

When an insulating resin of which main component is a film-like thermoset epoxy resin is used as the material of the first insulating layer 12, the film-like first insulating layer 12 may be laminated on the etching stopper layer 22 so as to cover the first wiring layers 11. While pressing the laminated first insulating layer 12, the first insulating layer 12 is heated at the curing temperature or higher and cured or hardened. It is possible to prevent voids from being formed by laminating the first insulating layer 12 under a vacuum atmosphere.

When an insulating resin of which main component is a liquid-like thermoset epoxy resin or a paste-like thermoset epoxy resin is used as the material of the first insulating layer 12, the liquid-like or paste-like first insulating layer 12 may be coated on the etching stopper layer 22 so as to cover the first wiring layers 11. The coated first insulating layer 12 is heated at the curing temperature or higher to harden the coated first insulating layer 12.

If the surface of the first insulating layer 11 is roughened by etching before the process illustrated in FIG. 11, it is possible to improve contact between the first wiring layers 11 and the first insulating layer in the process illustrated in FIG. 11.

Figure 12:
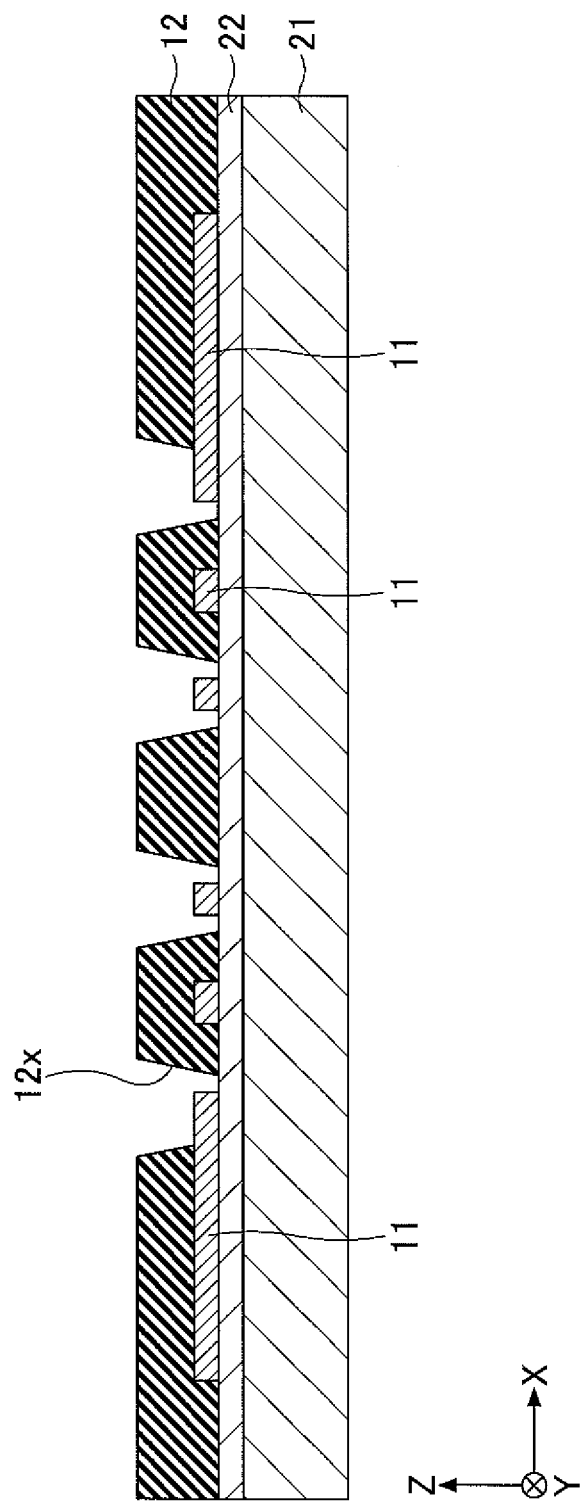
FIG. 12 is a sixth view of the exemplary manufacturing process of the wiring substrate of the First Embodiment.
Figure 13:
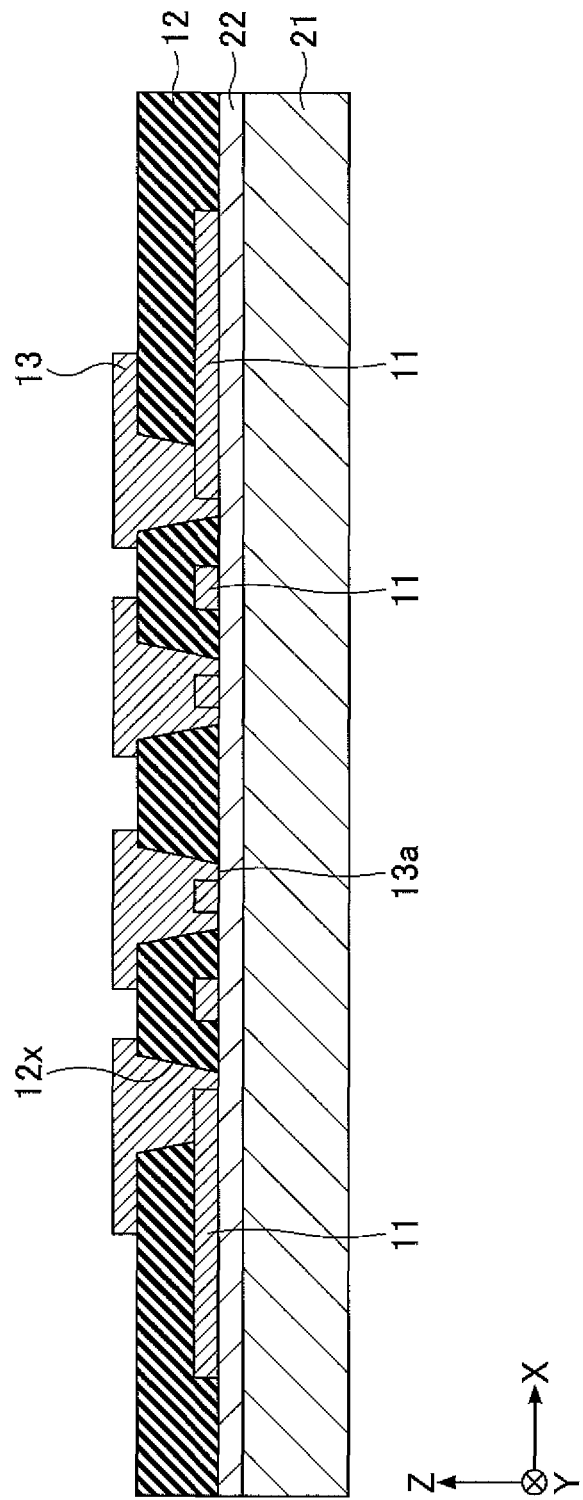
FIG. 13 is a seventh view of the exemplary manufacturing process of the wiring substrate of the First Embodiment.

Next, in the process illustrated in FIG. 12, the first via holes 12x penetrating the first insulating layer 12 are formed. A part or all of the first via holes 12x are formed to expose the upper surfaces and side surfaces of the first wiring layers 11. This is because a part or all of via wirings forming the second wiring layers 13 formed in the process illustrated in FIG. 13 are connected to the first wiring layers 11. Said differently, a part of the first wiring layers 11 is wired from the end portions of the via wirings (the first electrode pads 13) forming the second wiring layers 13 as the wiring patterns. Said differently, the part of the first wiring layers 11 overlaps the end portions of the via wirings (the first electrode pads 13). By connecting the part or all of the via wirings forming the second wiring layers 13 which are to be formed as illustrated in FIG. 13 to the first wiring layers 11, the connection areas between the first wiring layers 11 and the first electrode pads 13 increase thereby improving connection reliability.

Figure 14:
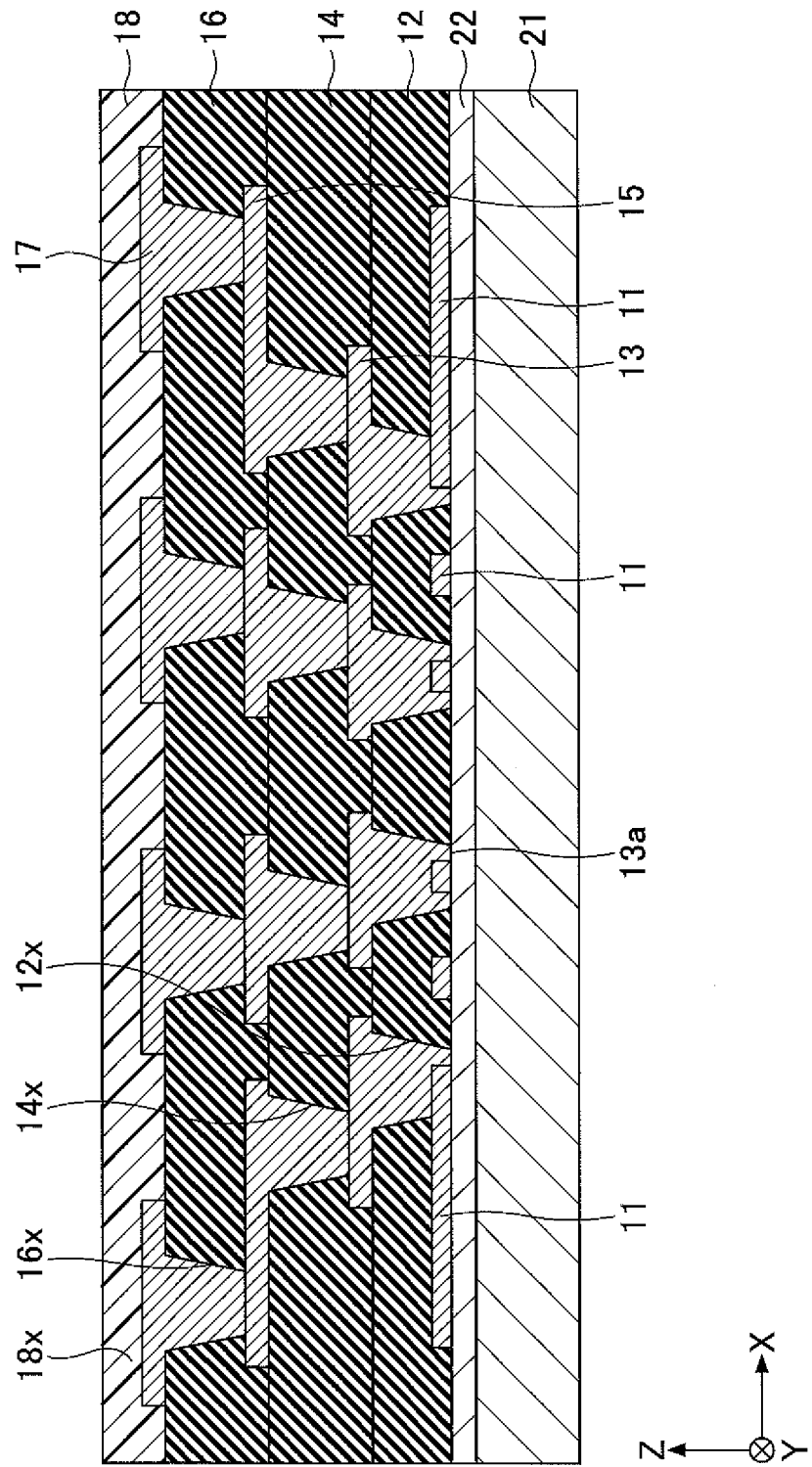
FIG. 14 is an eighth view of the exemplary manufacturing process of the wiring substrate of the First Embodiment.

The first via holes 12x may be formed by a laser processing method using, for example, $CO_2$ laser. The first via holes 12x are shaped like a truncated cone in which the area of the opening portion on the side of the second insulating layer 14 formed in the process illustrated in FIG. 14 is greater than the area of the opening portion on the side of the etching stopper layer 22. Plan views of the opening portions of the first via holes 12x on the side of the etching stopper layer 22 are, for example, a circle having a diameter of about 40 to 60 μm. The pitch of the opening portions of the first via holes 12x on the side of the etching stopper layer 22 is, for example, about 70 to 100 μm.

If the other via holes are formed by the laser processing method, the shapes of the other via holes become substantially similar to those of the first via holes 12x. When the first via holes 12x are formed by the laser processing method, a desmear process is performed to remove resin residue on the first insulating layer 12 adhered to the upper surfaces of the first wiring layers 11 which are exposed at the bottom portions of the first via holes 12x or the upper surfaces of the etching stopper layer 22.

Referring to FIG. 13, the second wiring layers 13 are formed on the first insulating layer 12. The material of the second wiring layers 13 may be copper (Cu) or the like. The second wiring layers 13 include via wirings filling the first via hole 12x and a wiring pattern formed on the first insulating layer 12. The first wiring layers 11 exposed from the bottom portions of the first via holes constitute a part of the end portions of the via wirings (the first electrode pads 13) forming the second wiring layers 13. However, all of the end portions of the via wirings (the first electrode pads 13) may not contain the first wiring layers 11. A part of the end portions of the via wirings may not contain the first wiring layers 11.

The second wiring layers 13 may be formed by various wiring forming methods such as a semi-additive method and a subtractive method. As an example, a method of forming the second wiring layers 13 using the semi-additive method is descried next.

First, a seed layer (not illustrated) made of copper (Cu) or the like is formed on the first insulating layer 12 including the upper surfaces and side surfaces of the first wiring layers 11 exposed at the bottom portions of the first via holes 12x, the upper surfaces of the etching stopper layers 22, and side walls of the first via holes 12x. Further, a resist layer (not illustrated) having opening portions corresponding to the second wiring layers 13 are formed on the seed layer. Wiring layers (not illustrated) made of copper (Cu) are formed on the opening portions of the resist layer by an electrolytic plating method in which the seed layer is used as the power supply layer. Subsequently, after removing the resist layer, a portion of the seed layer which is not covered by the wiring layers is removed by etching using the wiring layers as a mask. With this, the second wiring layers 13 including the via wirings filling the first via holes 12x in the first insulating layer 12 and the wiring patterns formed on the first insulating layer 12 are formed.

Referring to FIG. 14, by repeating processes similar to the above processes, the second insulating layer 14, the third wiring layers 15, the third insulating layer 16, the fourth wiring layers 17, and the solder resist layer 18 are laminated. Said differently, after forming the second insulating layer 14 covering the second wiring layers 13 on the first insulating layer 12, the second via holes 14x are formed to penetrate the second insulating layer 14 and enable the upper surfaces of the second wiring layers 13 to be exposed to the outside. The material of the second insulating layer 14 is preferably similar to that of the first insulating layer 12 such as an insulating resin. The thickness of the second insulating layer 14 may be about 15 to 35 µm. The second insulating layer 14 may contain a filler made of silica ($SiO_2$).

Further, third wiring layers 15 to be connected to the second wiring layers 13 are formed on the second insulating layer 14 via the second via holes 14x. The third wiring layers 15 include via wirings filling the second via holes 14x and wiring patterns formed on the second insulating layer 14. The third wiring layers 15 are electrically connected to the second wiring layers 13 exposed at the bottom portions of the second via holes 14x. For example, the material of the third wiring layers 15 may be copper (Cu) or the like. For example, the third wiring layers 15 may be formed by a semi-additive method. For example, the thicknesses of the third wiring layers 15 may be about 10 to 20 µm.

After forming the third insulating layer 16 covering the third wiring layers 15 on the second insulating layer 14, third via holes 16x are formed to penetrate the third insulating layer 16 and enable the upper surfaces of the third wiring layers 15 to be exposed to the outside. The material of the third insulating layer 16 may be similar to the materials of the first insulating layer 12 and the second insulating layer 14 such as an insulating resin. For example, the thickness of the third insulating layer 16 may be about 15 through 35 µm. The third insulating layer 16 may contain a filler made of silica ($SiO_2$).

Further, the fourth wiring layers 17 to be connected to the third wiring layers 15 are formed on the third insulating layer 16 via the third via holes 16x. The fourth wiring layers 17 include via wirings filled inside the third via holes 16x and wiring patterns formed on the third insulating layer 16. The fourth wiring layers 17 are electrically connected to the third wiring layers 15 exposed at the bottom portions of the third via holes 16x. For example, the material of the fourth wiring layers 17 may be copper (Cu) or the like. For example, the fourth wiring layers 17 may be formed by a semi-additive method. For example, the thicknesses of the fourth wiring layers 17 may be about 10 to 20 µm.

As described, a predetermined built-up wiring substrate is formed on one surface of the supporting body via the etching stopper layer 22. With the First Embodiment, the three-layered built-up wiring substrate including the second wiring layers 13, the third wiring layers 15, and the fourth wiring layers 17 is formed. However, an n-layered built-up wiring substrate (n is an integer of 1 or more) may be formed instead.

Further, the solder resist layer 18 covering the fourth wiring layers 17 formed on the third insulating layer 16 is formed. The solder resist layer 18 may be formed by coating a liquid-like or paste-like photosensitive insulating resin of an epoxy type or an acrylic type on the third insulating layer 16 so as to coat the fourth wiring layers 17 with a screen printing method, a roll coating method, a spin coat method or the like. For example, a film-like photosensitive insulating resin of an epoxy type or an acrylic type or the like may form the resist layer 18 by laminating on the third insulating layer 16 to coat the fourth wiring layer 17. The thickness of the solder resist layer 18 may be about 15 to 35 µm.

Figure 15:
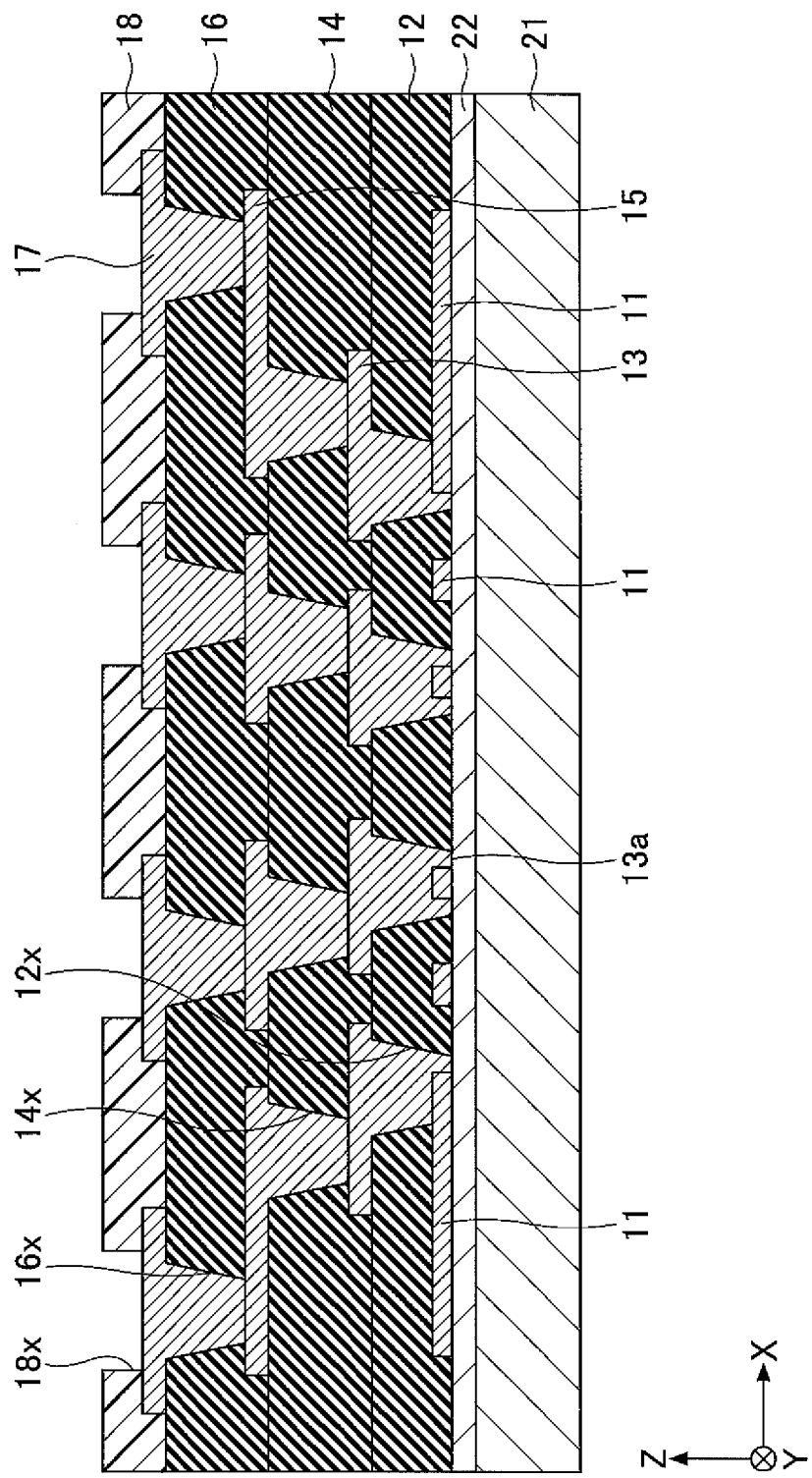
FIG. 15 is a ninth view of the exemplary manufacturing process of the wiring substrate of the First Embodiment.

Next, in the process illustrated in FIG. 15, opening portions 18x are formed in the solder resist layer 18. For example, the opening portions 18x are formed by exposing the coated or laminated photosensitive insulating resin in the process illustrated in FIG. 14 to light and develop the insulating resin (a photolithographic method). In the process illustrated in FIG. 14, a film-like insulating resin having opening portions 18x may be laminated on the third insulating layer 16 so as to cover the fourth wiring layer 17. The material of the solder resist layer 18 may be a non-photosensitive insulating resin. In this case, the solder resist layer 18 is formed on the third insulating layer 16 and cured. Thereafter, the opening portions 18x may be formed by a laser processing method using a CO2 laser or the like or a blast process using an abrading agent such as alumina abrasive grains.

With the process illustrated in FIG. 15, the solder resist layer 18 having the opening portions 18x is formed, and parts of the fourth wiring layers 17 are exposed inside the opening portions 18x. The fourth wiring layers 17 exposed inside the opening portions 18x function as electrode pads for electrically connecting to pads installed in a mounting board (not illustrated) such as a motherboard.

When necessary, metallic layers or the like may be formed on the fourth wiring layers 17 which are exposed at the bottom portions of the opening portions 18x. An example of the metallic layers is an Au layer, a Ni/Au layer which is a metallic layer formed by laminating a Ni layer and an Au layer in this order, a Ni/Pd/Au layer which is a metallic layer formed by laminating a Ni layer, a Pd layer, and an Au layer in this order or the like.

Figure 16:
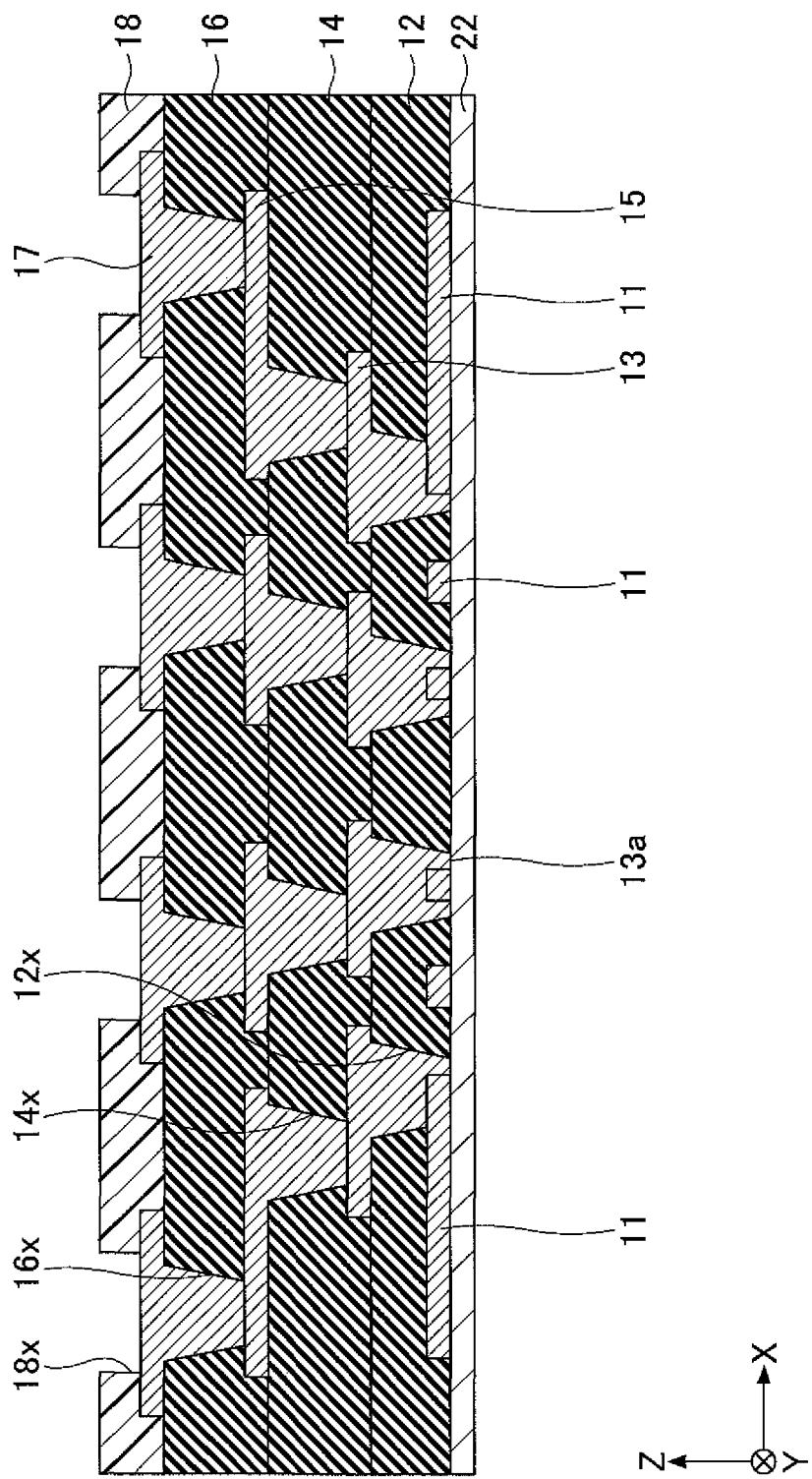
FIG. 16 is a tenth view of the exemplary manufacturing process of the wiring substrate of the First Embodiment.

The supporting body 21 illustrated in FIG. 15 is removed in the process illustrated in FIG. 16. The supporting body 21 made of a copper foil may be removed by wet etching using, for example, aqueous ferric chloride, aqueous copper chloride, aqueous ammonium persulfate, ammonium copper chloride, hydrogen peroxide solution, etchant of sulfuric acid system or the like. At this time, because the etching stopper layer 22 is made of a material which is not removed together with copper (Cu) such as nickel (Ni), only the supporting body 21 made of a copper foil may be selectively etched. However, if the fourth wiring layers 17 are made of copper (Cu), the fourth wiring layers may be masked in order to prevent the fourth wiring layers 17 exposed at the bottom portions of the opening portions 18x from being etched.

After the process illustrated in FIG. 16, the etching stopper layer 22 illustrated in FIG. 16 may be removed. If the etching stopper layer 22 is made of nickel (Ni), the etching stopper layer 22 may be removed by wet etching using, for example, hydrogen peroxide solution and etchant of nitric acid series. At this time, because the first wiring layers 11 and the first electrode pads 13 exposed from the first insulating layer 12 are made of copper (Cu), only the etching stopper layer 22 made of nickel (Ni) can be selectively etched.

After removing the etching stopper layer 22, outer connection terminals such as a solder ball and a pin may be formed on the fourth wiring layers 17 which are exposed at the bottom portions of the opening portions 18x or on the metallic layers when the metallic layers are formed in the fourth wiring layers 17 exposed at the bottom portions of the opening portions 18x. The external connection terminals are provided to electrically connect the wiring substrate to the mounting board (not illustrated) such as a mother board. However, the fourth wiring layers 17 exposed at the bottom portions of the opening portions 18x or the metallic layers when the metallic layers are formed on the fourth wiring layers 17 may be used as the external connection terminals. Before removing the supporting body 21 or the etching stopper layer 22, external connection terminals such as solder balls and lead pins may be formed.

Referring to FIG. 7 to FIG. 16, the exemplary manufacturing method of the wiring substrate 10 using the etching stopper layer 22 on the supporting body 21 is described. However, members for plural wiring substrates 10 may be made using the etching stopper layer 22, and the plural wiring substrates 10 may be separated into plural wiring substrates after removing the supporting body 21 and the etching stopper layer.

Further, referring to FIG. 7 to FIG. 16, the example of using the copper foil as the supporting body 21 is described. However, a metallic foil or a metallic plate made of nickel (Ni), tin (Sn), chrome (Cr) or the like may be used as the supporting body 21. Because it is possible to omit the process of forming the etching stopper layer 22 illustrated in FIG. 8 and the process of removing the etching stopper layer 22 after the process illustrated in FIG. 16, the manufacturing process of the wiring substrate 10 can be simplified. In this case, in the process illustrated in FIG. 16, the metallic foil and the metallic plate made of nickel (Ni), tin (Sn), chrome (Cr) or the like can be selectively removed by etchant. At this time, because the lower surface of the first wiring layers 11 and the first electrode pads 13 exposed from the first insulating layer 12 are made of copper (Cu), only the metallic foil and the metallic plate made of nickel (Ni), tin (Sn), chrome (Cr) or the like can be selectively removed by etchant.

Figure 17:
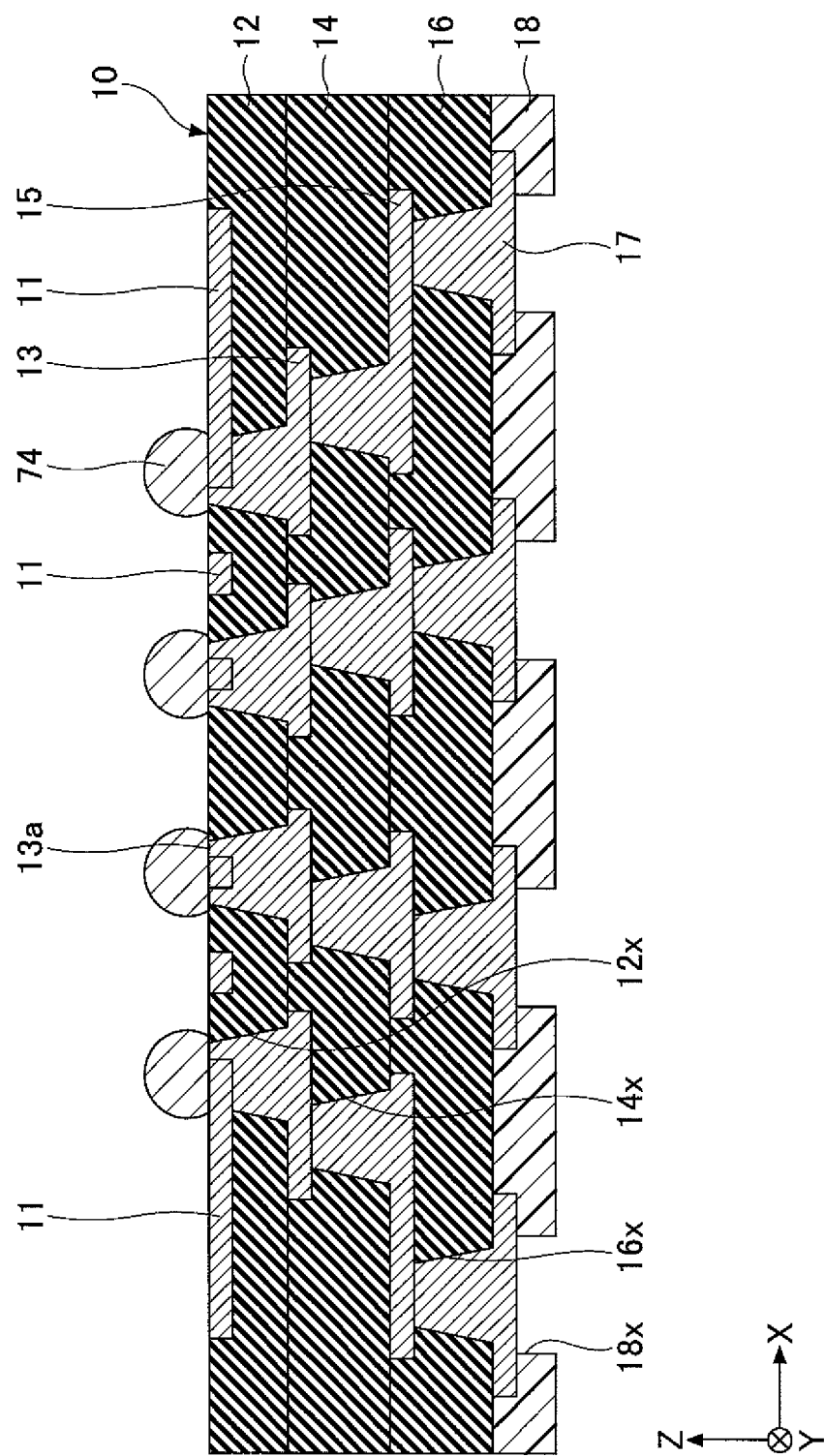
FIG. 17 is a first view illustrating a semiconductor package of the First Embodiment.
Figure 18:
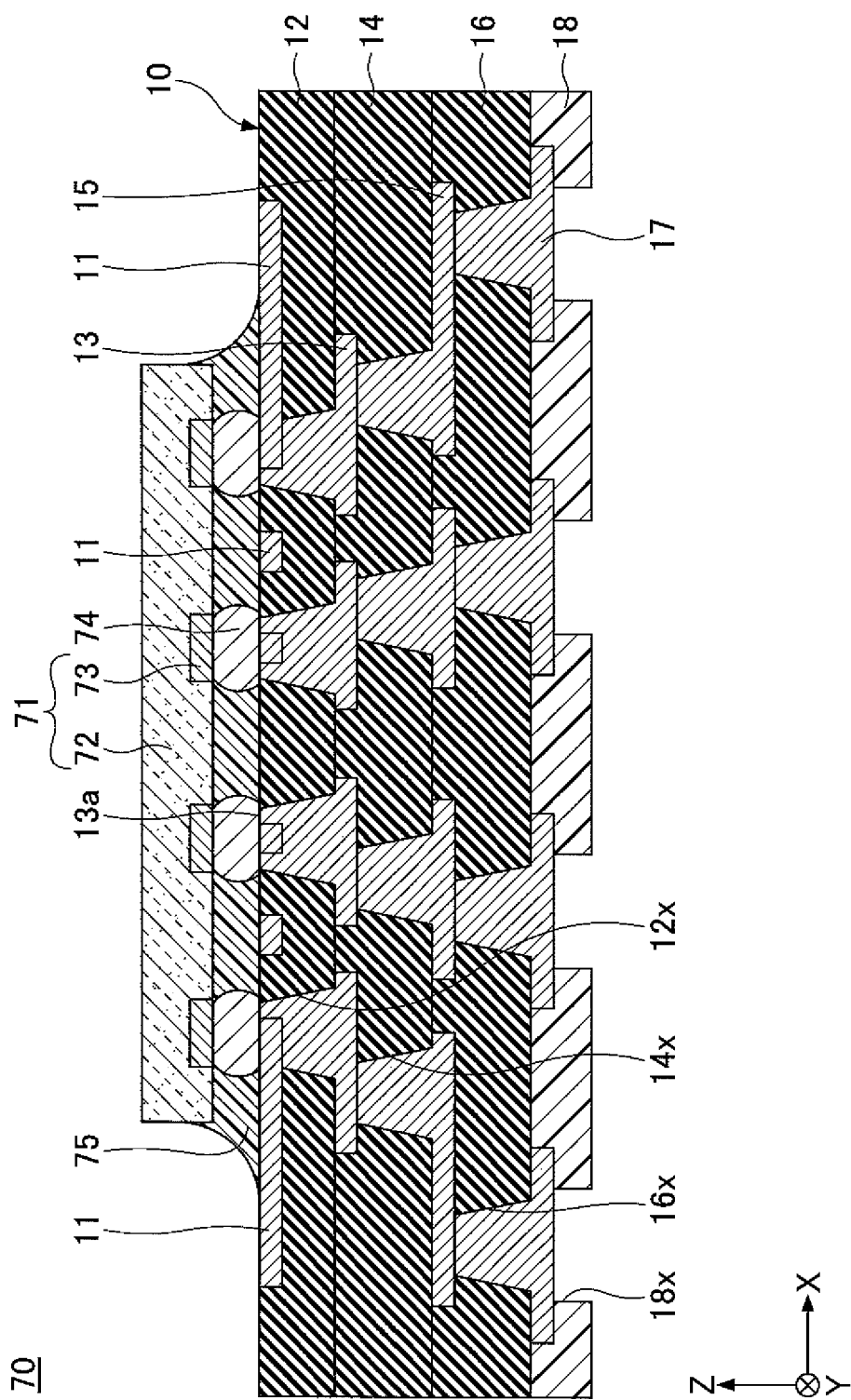
FIG. 18 is a second view illustrating the semiconductor package of the First Embodiment.

With the processes illustrated in FIG. 7 to FIG. 16, the wiring substrate 10 is finished as illustrated in FIG. 5 and FIG. 6. Further, it is possible to manufacture the semiconductor package in which a semiconductor chip is installed in the wiring substrate 10 as illustrated in FIG. 17 and FIG. 18. FIG. 17 and FIG. 18 illustrate the semiconductor package of the First Embodiment. Referring to FIG. 17 and FIG. 18, the wiring substrate 10 of FIG. 5 is drawn upside down.

Referring to FIG. 17, solder balls are formed on the first electrode pads of the wiring substrate 10. The solder balls 74 may be formed by mounting the solder balls 74 on the first electrode pads 13, and reflowing the solder balls 74 by partly melting the solder balls. The material of the solder balls 74 may be an alloy containing Pb, an alloy containing Sn and Cu, an alloy containing Sn and Ag, an alloy containing Sn, Ag, and Cu, or the like. The solder balls 74 may function as the external connection terminals to be connected to the semiconductor chip. The wiring substrate 10 may be finished to have the solder balls 74 on the first electrode pads 13 as a finished state for shipping.

Referring to FIG. 18, a semiconductor package 70 including the wiring substrate 10 and a semiconductor chip 71 mounted on the wiring substrate 10 via the solder balls 74 is manufactured. Specifically, the solder balls 74 of the wiring substrate 10 and electrode pads 73 of the semiconductor chip 71 are arranged so that the solder balls 74 positionally correspond to electrode pads 73. Then, the solder balls 74 are heated at, for example, 230° C. to melt the solder and electrically connect the solder balls 74 with the electrode pads 73. If solder is provided on the electrode pads 73 in advance, the solder on the electrode pads 73 and the solder balls are melted to be corresponding bumps made of alloys. Thereafter, by supplying an underfill resin 75 between the semiconductor chip 71 and the wiring substrate 10, the semiconductor package 70 is finished.

Referring to FIG. 17 and FIG. 18, the exemplary manufacturing method of the semiconductor package 70 formed by mounting the semiconductor chip 71 on the wiring substrate 10 via the solder balls 74 is illustrated. However, an anisotropically-conductive film (an anisotropically-conductive adhesive film) and bumps may be used instead of the solder balls 74. The anisotropically-conductive film (the anisotropically-conductive adhesive film) is a semi cured resin film (a thermoset resin of epoxy system) in which conductive particles such as nickel (Ni), gold (Au) and silver (Au) are dispersed.

Specifically, referring to FIG. 17, the semi cured anisotropically-conductive film is adhered (provisionally adhered) on an area of first electrode pads of the wiring substrate 10 on which the semiconductor chip 71 is to be mounted. Next, the semiconductor chip 71 having various bumps such as gold bumps formed on the electrode pads by wire bonding and column-like electrodes made of copper plating is prepared. Then, the semiconductor chip 71 is arranged on the area for mounting the semiconductor chip 71 by a bonding tool so that the first electrode pads 13 of the wiring substrate 10 correspond to the bumps of the semiconductor chip 71 via the anisotropically-conductive film. Next, the semiconductor chip 71 is pushed (finally pressed) onto the anisotropically-conductive film by the bonding tool to thereby connect the bumps of the semiconductor chip 71 to the first electrode pads 13 of the wiring substrate 10. At this time, the semiconductor chip 71 is pushed toward the anisotropically-conductive film while heating the semiconductor chip 71 by the bonding tool thereby curing the semi cured anisotropically-conductive film. At this time, the anisotropically-conductive film is sandwiched between the first electrode pads 13 of the wiring substrate 10 and the bumps of the semiconductor chip 71 and compressed. Therefore, the conductive particles dispersed in the anisotropically-conductive film mutually contact to thereby electrically connect the first electrode pads 13 of the wiring substrate 10 to the bumps of the semiconductor chip 71.

There may be a case where the solder of the solder ball 74 flows across the first wiring layers 11 (the wiring patterns) which are directly wired from the first electrode pads 13 when the wiring substrate 10 is connected to the semiconductor chip 71 via the solder balls 74. Further, the solder of the solder balls 74 may short-circuit the first wiring layers 11 (the wiring patterns) arranged in the vicinity of the first electrode pads 13. In this case, it is effective to connect the wiring substrate 10 to the semiconductor chip 71 via the anisotropically-conductive film.

As described, with the First Embodiment, the end portions of the via wirings are exposed from the lower surface of the first insulating layer 12 to function as the first electrode pads 13, and the pitch of the first electrode pads 13 is made smaller than ever to attain the narrow pitch by wiring the first wiring layers 11 as the wiring pattern from a part or all of the first electrode pads 13 (the end portions of the via wirings).

The diameters of the exposed faces (the faces 13a of the via wirings) of the first electrode pads 13 (the portions of the via wirings) are smaller than the diameters of the first electrode pads 13 on the side of the second insulating layer 14 to thereby form a tapered shape. A part or all of the first electrode pads 13 cover and are in contact with the upper surfaces and the side surfaces of the first wiring layers 11. Therefore, the tension strength of the first electrode pads 13 is great to thereby improve connection reliability when the semiconductor chip is mounted on the first electrode pads 13.

Modified Example of the First Embodiment

With the modified example of the First Embodiment, an Organic Solderability Preservation (OSP) process is provided in the lower surfaces of the first wiring layers 11 and the face 13a of the via wiring exposed from the first insulating layer 12.

Figure 19:
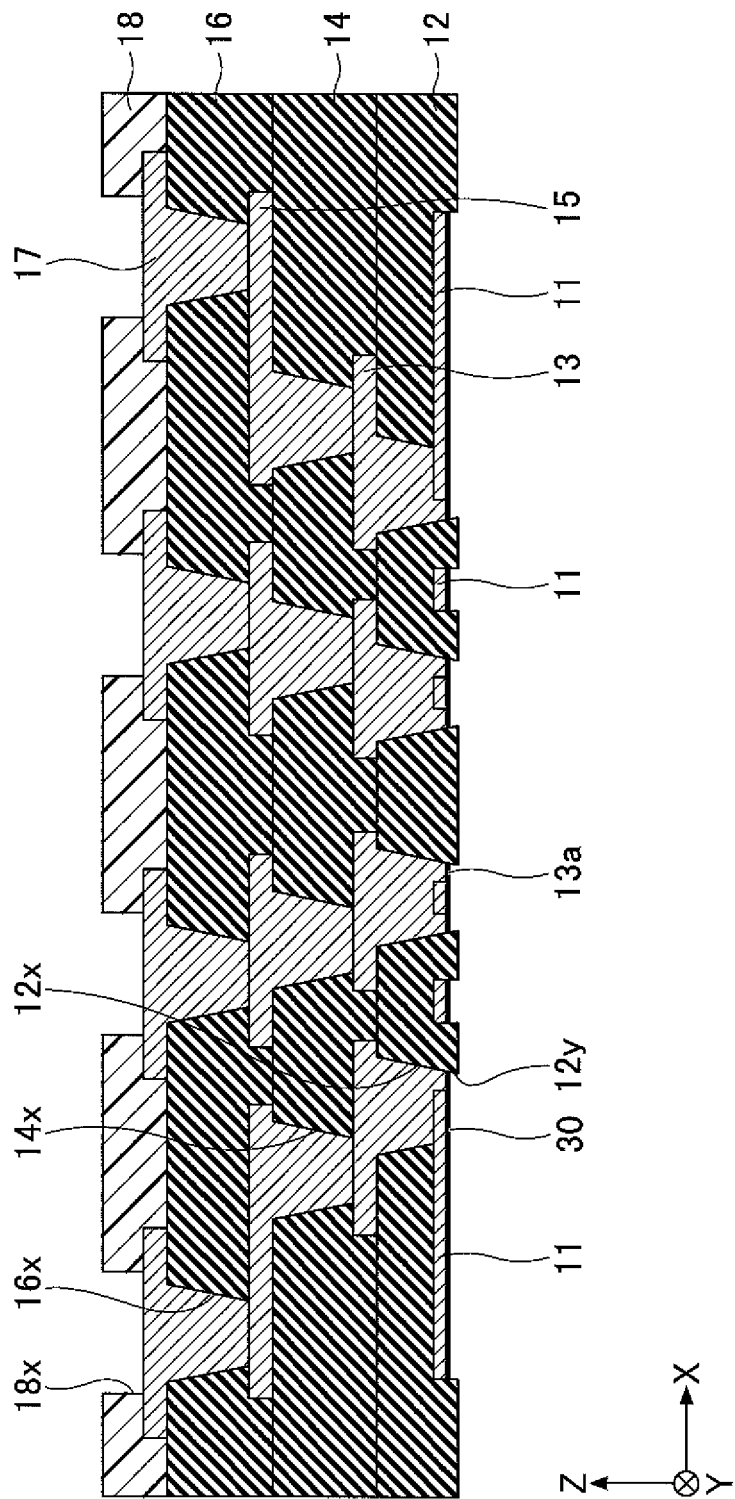
FIG. 19 is a cross-sectional view of a modified exemplary wiring substrate of the First Embodiment.
Figure 20:
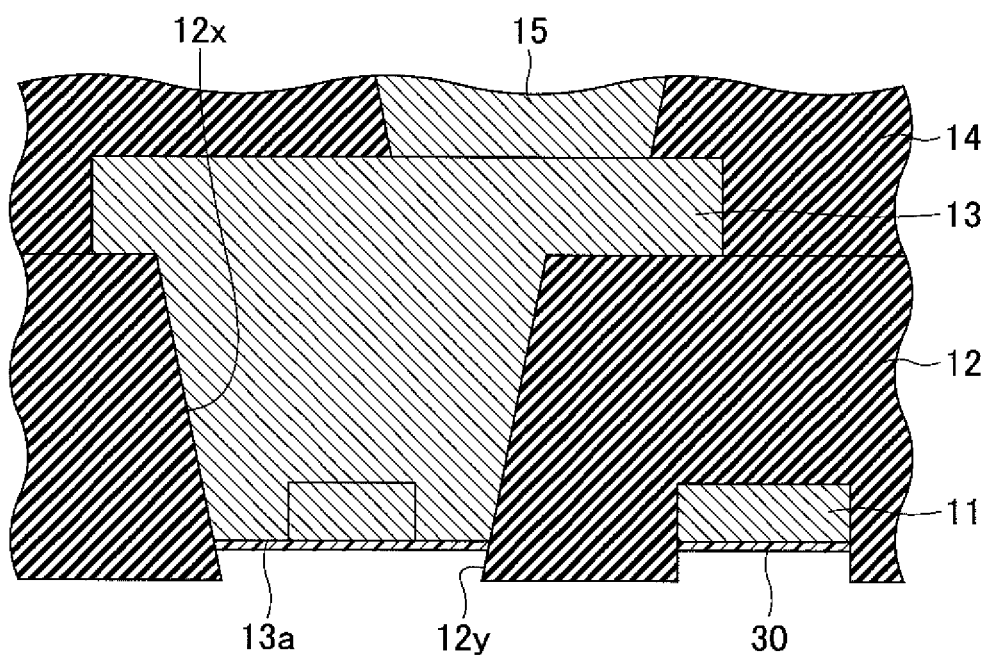
FIG. 20 is an enlarged cross-sectional view illustrating a part of FIG. 19.

FIG. 19 is a cross-sectional view of an exemplary wiring substrate of modified example 1 of the First Embodiment. FIG. 20 is the enlarged cross-sectional view illustrating a part of the cross-sectional view illustrated in FIG. 19. The wiring substrate 10A of the modified example of the First Embodiment illustrated in FIG. 19 and FIG. 20 differs from the wiring substrate 10 (see FIG. 5) of the First Embodiment in that the lower surfaces of the first wiring layers 11 and the faces 13a of the via wirings are positioned inside recesses 12y provided on the lower surface of the first insulating layer 12, and that an organic film 30 is formed on the lower surfaces of the first wiring layers 11 and the faces 13a of the via wirings. The OSP process is to form an organic film on a surface of an object in order to prevent the surface from being oxidized.

In order to provide the OSP process, the wiring substrate 10 illustrated in FIG. 5 is prepared. In the wiring substrate 10 illustrated in FIG. 5, the lower surfaces of the first wiring layers 11 and the faces 13a of the via wirings exposed from the first insulating layer 12 and the lower surface of the first insulating layer 12 are substantially on the same plane.

Next, the lower surfaces of the first wiring layers 11 and the faces 13a of the via wirings exposed from the first insulating layer 12 undergo soft-etching to form the recesses 12y. For example, a sulfuric acid/hydrogen peroxide mixture may be used for the soft-etching. The depths of the recesses 12y after the soft-etching are about 2 to 3 μm.

Next, the OSP process is performed on the lower surfaces of the first wiring layers 11 and the faces 13a of the via wirings exposed inside the recesses 12y to form the organic film 30. Specifically, an acid aqueous solution containing, for example, an azole compound or an imidazole compound is coated on the lower surfaces of the first wiring layers 11 and the faces 13a of the via wirings exposed inside the recesses 12y by a spraying method, a showering method, a dipping method or the like. Thereafter, the acid aqueous solution is dried to form the organic film 30. The organic film 30 is selectively absorbed to copper (Cu). The film thickness of the organic film 30 is, for example, about 1 μm.

With the modified example of First Embodiment, effects similar to those in First Embodiment are obtainable. Further, the following effects are obtainable. Said differently, the lower surfaces of the first wiring layers 11 and the faces 13a of the via wirings exposed from the first insulating layer 12 undergo the soft-etching to form the recesses 12y, and lower surfaces of the first wiring layers 11 and the faces 13a of the via wirings exposed in the recesses 12y undergo the OSP process to form the organic film 30 on the lower surfaces of the first wiring layers 11 and the faces 13a of the via wirings. With this, the lower surfaces of the first wiring layers 11 and the faces 13a of the via wirings inside the recesses 12y are prevented from being oxidized to thereby improve connection reliability among the first electrode pads 13, the solder balls and so on.

As described, the embodiments of the present invention provide the wiring substrate and the manufacturing method of the wiring substrate, by which the pitch of the electrode pads is reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:
    a plurality of insulating layers including an outermost insulating layer; and
    a plurality of wiring layers which are alternately laminated between the insulating layers and include
        outermost wiring layers exposed from the outermost insulating layer, and
        through wirings having electrode pads on end portions of the through wirings and penetrating through the outermost insulating layer,
    wherein the electrode pads of the through wirings are exposed from the outermost insulating layer, and
    a part of the outermost wiring layers overlaps the end portions of the through wirings and is connected to the through wirings,
    wherein exposed faces of the through wirings and faces opposite to the exposed faces of the through wirings are circular, and
    diameters of the exposed faces are smaller than diameters of the opposite faces of the through wirings,
    wherein at least one through wiring of the through wirings contacts an upper surface and side surfaces of an end part of the outermost wiring layers,
    wherein the outermost insulating layer contacts an upper surface and side surfaces of parts of the outermost wiring layers other than the end part so that the parts of the outermost wiring layers are embedded in the outermost insulating layer.

2. The wiring substrate according to claim 1,
    wherein exposed faces of the outermost wiring layers, exposed faces of the end portions of the through wirings and a surface of the outermost insulating layer are arranged on the same plane.

3. The wiring substrate according to claim 1,
    wherein exposed faces of the outermost wiring layers and the exposed faces of the through wirings are recessed from an outermost lower surface of the outermost insulating layer.

4. The wiring substrate according to claim 1,
    wherein another part of the outermost wiring layers is wired between the adjacent through wirings.

5. The wiring substrate according to claim 1,
    wherein other electrode pads are exposed from another outermost insulating layer, the electrode pads are configured to electrically connect a semiconductor chip, and
the other electrode pads are configured to electrically connect another wiring substrate.

* * * * *